(12) United States Patent
Chiang et al.

(10) Patent No.: US 10,791,642 B2
(45) Date of Patent: Sep. 29, 2020

(54) HOUSING STRUCTURE AND MANUFACTURING METHOD THEREOF

(71) Applicant: Primax Electronics Ltd., Taipei (TW)

(72) Inventors: Hsiang-Mei Chiang, Taipei (TW); Wei-Chiang Huang, Taipei (TW); Jia-Hung Lin, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/423,998

(22) Filed: May 28, 2019

(65) Prior Publication Data

US 2020/0267860 A1 Aug. 20, 2020

(30) Foreign Application Priority Data

Feb. 15, 2019 (TW) .............................. 108105166 A

(51) Int. Cl.
  *H05K 5/00* (2006.01)
  *H05K 5/02* (2006.01)
  *B23K 103/00* (2006.01)
  *B23K 26/40* (2014.01)
  *B23K 26/364* (2014.01)

(52) U.S. Cl.
  CPC .......... *H05K 5/0243* (2013.01); *B23K 26/364* (2015.10); *B23K 26/40* (2013.01); *B23K 2103/42* (2018.08)

(58) Field of Classification Search
  CPC ....................................................... H05K 5/00
  See application file for complete search history.

(56) References Cited

U.S. PATENT DOCUMENTS

2003/0184894 A1* 10/2003 Bischof ............... H04M 1/0266
  359/894
2019/0064431 A1* 2/2019 Keranen .............. G02B 6/0065

FOREIGN PATENT DOCUMENTS

WO WO-2004114342 A1 * 12/2004 ............. H01H 9/182

* cited by examiner

*Primary Examiner* — Jerry Wu
(74) *Attorney, Agent, or Firm* — Kirton McConkie; Evan R. Witt

(57) ABSTRACT

A housing structure for an electronic device includes a light-transmissible housing body, a first light-shielding layer, a second light-shielding layer, a protective layer and an engraved trench. The first light-shielding layer is formed on a second surface of the light-transmissible housing body. The engraved trench is formed in the second surface of the light-transmissible housing body and not covered by the first light-shielding layer. The second light-shielding layer is formed on a first surface of the light-transmissible housing body. The protective layer is formed over the second light-shielding layer. A pattern corresponding to the engraved trench is visible.

11 Claims, 6 Drawing Sheets

HOUSING STRUCTURE AND
MANUFACTURING METHOD THEREOF

FIELD OF THE INVENTION

The present invention relates to a housing structure, and more particularly to a housing structure of an electronic device.

BACKGROUND OF THE INVENTION

In modern societies, electronic devices become indispensable parts in human lives. The electronic devices are applied in many sectors, including food, clothing, housing, transportation, education and entertainment.

Since a wide variety of electronic devices have been introduced into the market, the competition pressure is gradually increased. For allowing the electronic device to have distinctiveness, the manufacturer of the electronic device usually print or engrave a dedicated logo or symbol on the surface of the housing of the electronic device. Due to the distinctiveness, the electronic device can be distinguished from the similar products. Moreover, for allowing the appearance of the electronic device more attractive to the consumer, different textures or patterns are formed on the housing of the electronic device. Due to the textures or patterns, the electronic device provides the special visual effect. However, too many logos or patterns make the visual appearance of the electronic device confusing. Under this circumstance, the appearance consistency of the electronic device is impaired, and thus the user's desire to purchase the electronic device is declined.

For solving the above drawbacks, it is important to maintain the appearance consistency of the electronic device and allow the electronic device to provide distinctiveness and special visual effect.

SUMMARY OF THE INVENTION

The present invention provides a housing structure with a hidden pattern and a method for manufacturing the housing structure. When an illumination module within an electronic device is disabled, the pattern hidden in the housing structure is not visible. Consequently, the appearance consistency of the electronic device is maintained. When the illumination module within the electronic device is enabled, the pattern hidden in the housing structure is visible. Under this circumstance, the electronic device provides distinctiveness and special visual effect.

In accordance with an aspect of the present invention, a housing structure for an electronic device is provided. The housing structure includes a light-transmissible housing body, a first light-shielding layer, an engraved trench, a second light-shielding layer and a protective layer. The light-transmissible housing body has a first surface and a second surface. The first surface and the second surface are opposed to each other. The first light-shielding layer is formed on the second surface. The engraved trench is formed in the second surface. The engraved trench is not covered by the first light-shielding layer. The second light-shielding layer is formed on the first surface. The protective layer is formed over the second light-shielding layer. The engraved trench is used to display a pattern.

In an embodiment, the housing structure further includes a third light-shielding layer. The third light-shielding layer is arranged between the second light-shielding layer and the protective layer.

In an embodiment, the pattern is a picture, a text, a number, a symbol, or a combination thereof.

In an embodiment, the first light-shielding layer is made of rubbery paint, polyurethane paint, or the combination thereof.

In an embodiment, the second light-shielding layer is made of rubbery paint, polyurethane paint, or the combination thereof.

In an embodiment, the third light-shielding layer is made of rubbery paint, polyurethane paint, or the combination thereof.

In an embodiment, the protective layer is made of light curable paint.

In an embodiment, the light-transmissible housing body is made of acrylonitrile-butadiene-styrene resin, polycarbonate or acrylic resin.

In an embodiment, the electronic device further includes an illumination module. The illumination module is located beside the second surface of the electronic device. The illumination module emits a light beam to the engraved trench. Consequently, the pattern is shown on the first surface of the electronic device.

In an embodiment, the illumination module is a light emitting diode module, an organic light emitting diode module, a quantum dots light emitting diode module or an electroluminescence module.

In an embodiment, the electronic device is a mouse, a keyboard, a display screen, a desktop computer, a notebook computer, a tablet computer, a personal digital assistant, a smart phone, a game console, a printer, an office machine or a scanner.

In accordance with an aspect of the present invention, a method for manufacturing a housing structure is provided. In a step (a), a light-transmissible housing body is provided. The light-transmissible housing body has a first surface and a second surface. The first surface and the second surface are opposed to each other. In a step (b), a first light-shielding layer is formed on the second surface. In a step (c), an engraved trench is formed in the second surface, wherein the engraved trench is not covered by the first light-shielding layer. In a step (d), a second light-shielding layer is formed on the first surface. In a step (e), a protective layer is formed over the second light-shielding layer.

In an embodiment, the step (d) further includes a step of forming a third light-shielding layer on the second light-shielding layer.

Preferably, in the step (a), the light-transmissible housing body is made of acrylonitrile-butadiene-styrene resin, polycarbonate or acrylic resin.

Preferably, in the step (b), the first light-shielding layer is made of rubbery paint, polyurethane paint, or the combination thereof.

Preferably, in the step (d), the second light-shielding layer is made of rubbery paint, polyurethane paint, or the combination thereof.

Preferably, the third light-shielding layer is made of rubbery paint, polyurethane paint, or the combination thereof.

Preferably, in the step (e), the protective layer is made of light curable paint.

Preferably, in the step (c), the engraved trench is formed by a laser engraving process.

The above objects and advantages of the present invention will become more readily apparent to those ordinarily

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
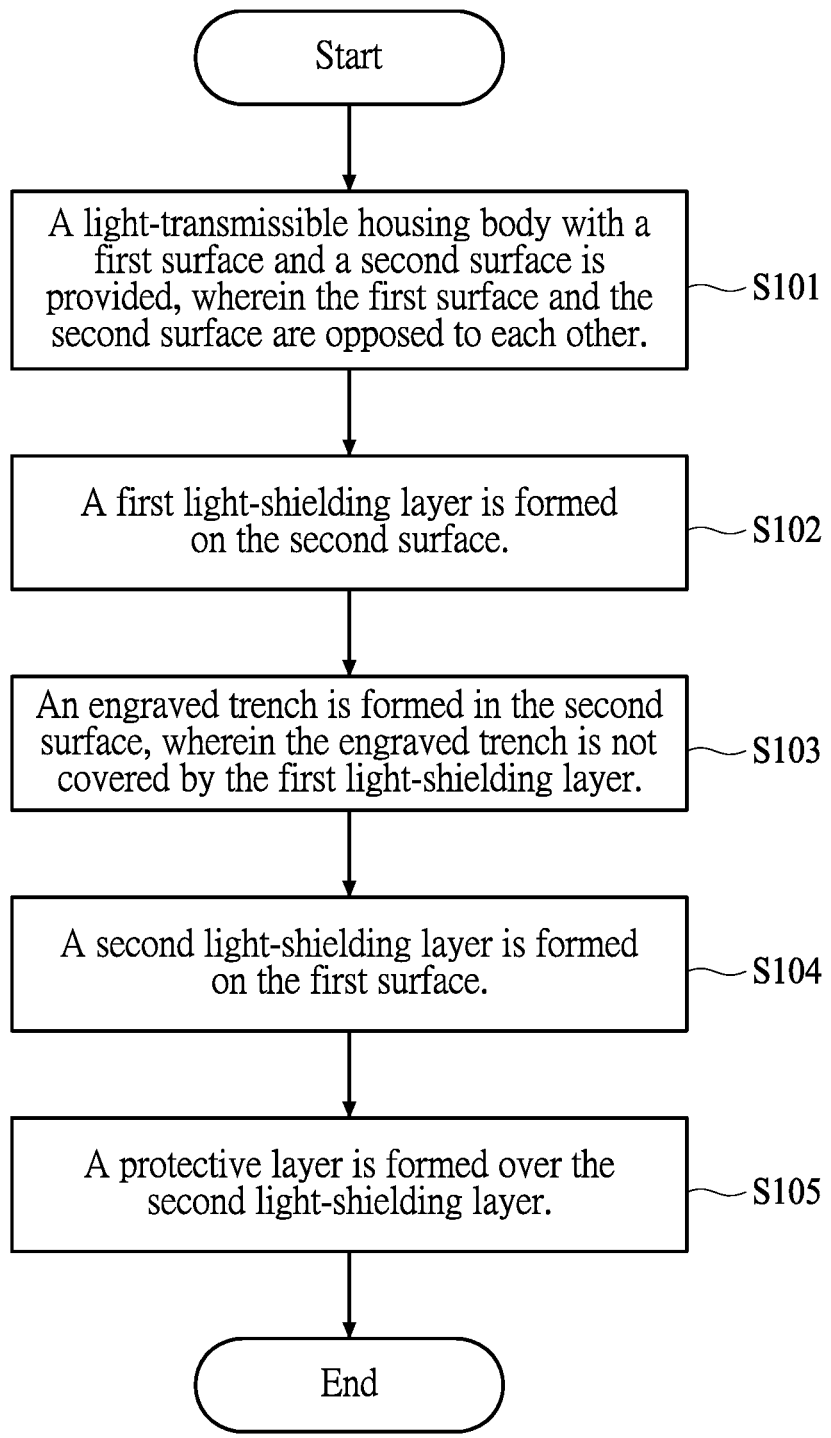
FIG. 1 is a flowchart of a method for manufacturing a housing structure according to the present invention.
Figure 2A:
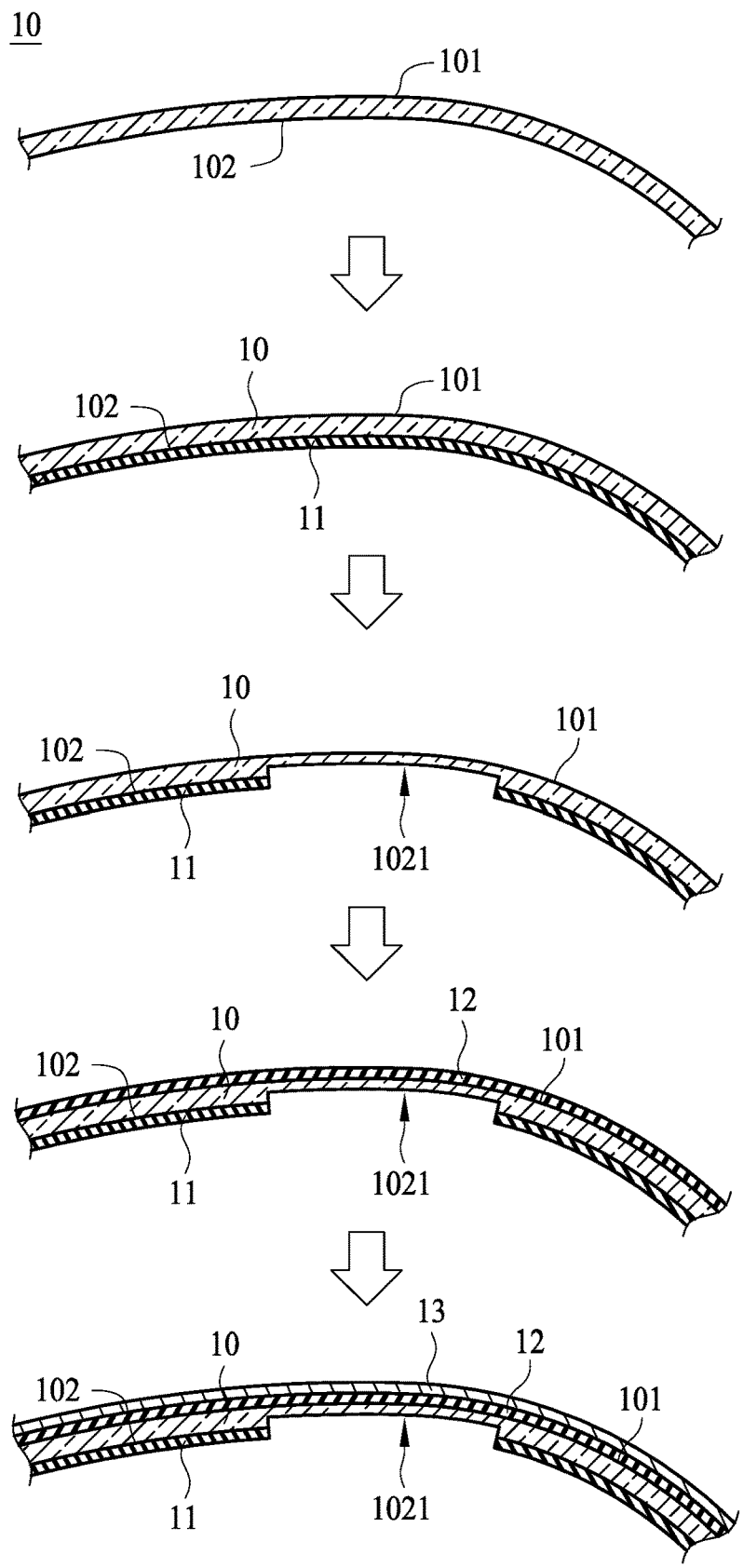
FIG. 2A schematically illustrates the steps of the method for manufacturing the housing structure according to a first embodiment of the present invention.

Please refer to FIG. 1 and FIG. 2A. FIG. 1 is a flowchart of a method for manufacturing a housing structure according to the present invention. FIG. 2A schematically illustrates the steps of the method for manufacturing the housing structure according to a first embodiment of the present invention.

Firstly, a light-transmissible housing body 10 is provided, wherein the light-transmissible housing body 10 has a first surface 101 and a second surface 102 (Step S101). The first surface 101 and the second surface 102 are opposed to each other. In the step S101, the light-transmissible housing body 10 is made of a completely-transparent light guiding material or a partially-transparent light guiding material. For example, the light-transmissible housing body 10 is made of acrylonitrile-butadiene-styrene (ABS) resin, polycarbonate (PC) or acrylic resin.

Then, a first light-shielding layer 11 is formed on the second surface 102 (Step S102). In the step S102, a paint material is sprayed on the second surface 102 in order to form the first light-shielding layer 11 on the second surface 102. The paint material for forming the first light-shielding layer 11 is rubbery paint, polyurethane (PU) paint, or the combination thereof.

Then, an engraved trench 1021 uncovered by the first light-shielding layer 11 is formed in the second surface 102 (Step S103). In the step S103, the engraved trench 1021 running through the first light-shielding layer 11 is formed in the second surface 102 by a laser engraving process. When the engraved trench 1021 is irradiated by a light beam, a specified pattern is shown. For example, the specified pattern is a picture, a text, a number, a symbol, or a combination thereof.

Then, a second light-shielding layer 12 is formed on the first surface 101 (Step S104). In the step S104, a paint material is sprayed on the first surface 101 in order to form the first light-shielding layer 11 on the second surface 102. The paint material for forming the second light-shielding layer 12 is rubbery paint, polyurethane (PU) paint, or the combination thereof.

Afterwards, a protective layer 13 is formed on the second light-shielding layer 12 (Step S105). In the step S105, a paint material is sprayed on the second light-shielding layer 12 in order to form the protective layer 13 on the second light-shielding layer 12. The paint material for forming the protective layer 13 is light curable paint, e.g., ultraviolet curable paint. In an embodiment, the thickness of the second light-shielding layer 12 is in the range between 15 μm and 40 μm, and the thickness of the protective layer 13 is in the range between 15 μm and 40 μm. Moreover, the percentage of the light beam to be transmitted through the second light-shielding layer 12 and the protective layer 13 may be adjusted according to the thickness of the second light-shielding layer 12 and the thickness of the protective layer 13.

Figure 2B:
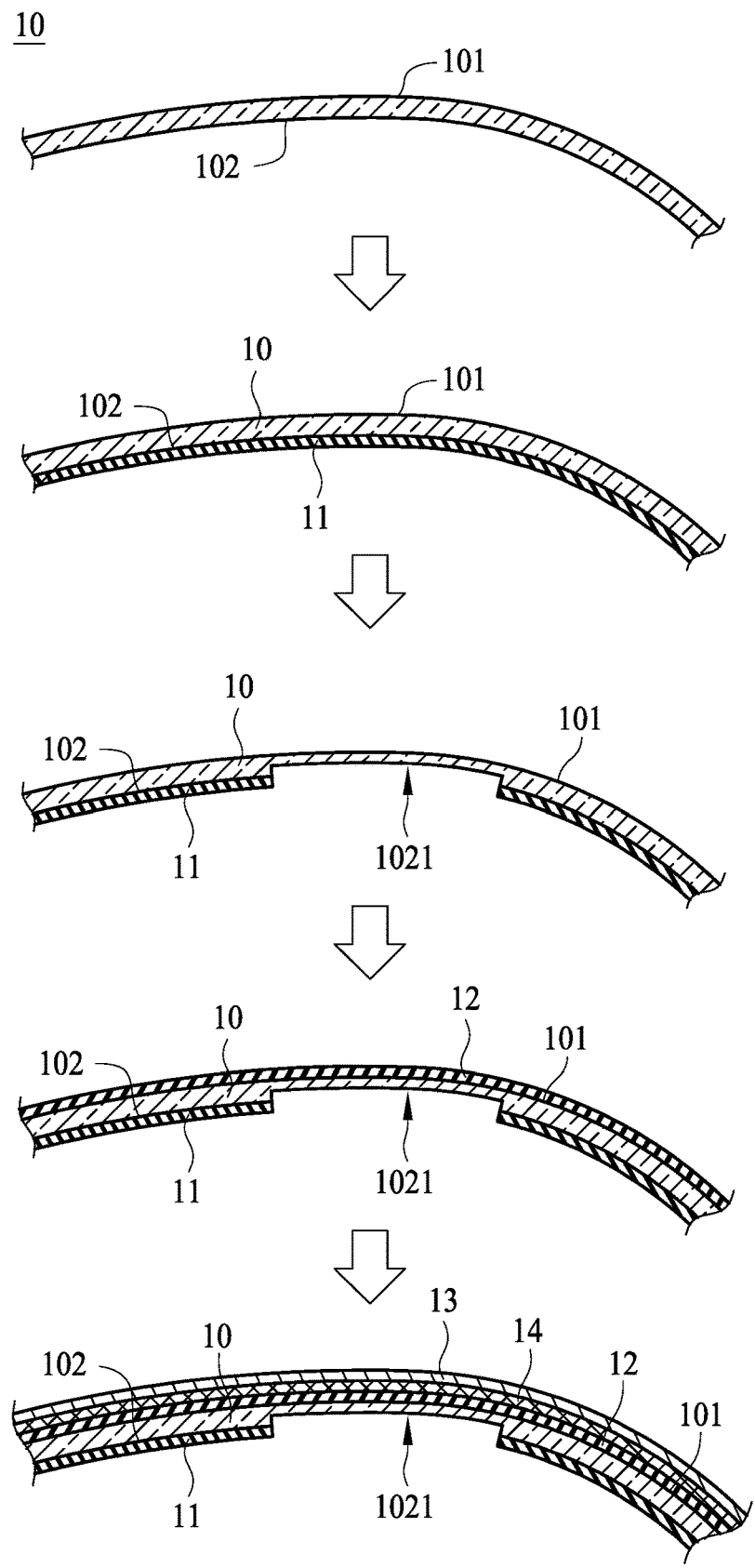
FIG. 2B schematically illustrates the steps of the method for manufacturing the housing structure according to a second embodiment of the present invention.

Please refer to FIG. 1 and FIG. 2B. FIG. 2B schematically illustrates the steps of the method for manufacturing the housing structure according to a second embodiment of the present invention. The steps S101, S102 and S103 of FIG. 2B are similar to those of FIG. 2A, and are not redundantly described herein. In this embodiment, a third light-shielding layer 14 is formed on the second light-shielding layer 12 after the second light-shielding layer 12 in the step S104. Moreover, the protective layer 13 is formed on the third light-shielding layer 14. The paint material for forming the third light-shielding layer 14 is rubbery paint, polyurethane (PU) paint, or the combination thereof. The thickness of the third light-shielding layer 14 is in the range between 15 μm and 40 μm.

Figure 3:
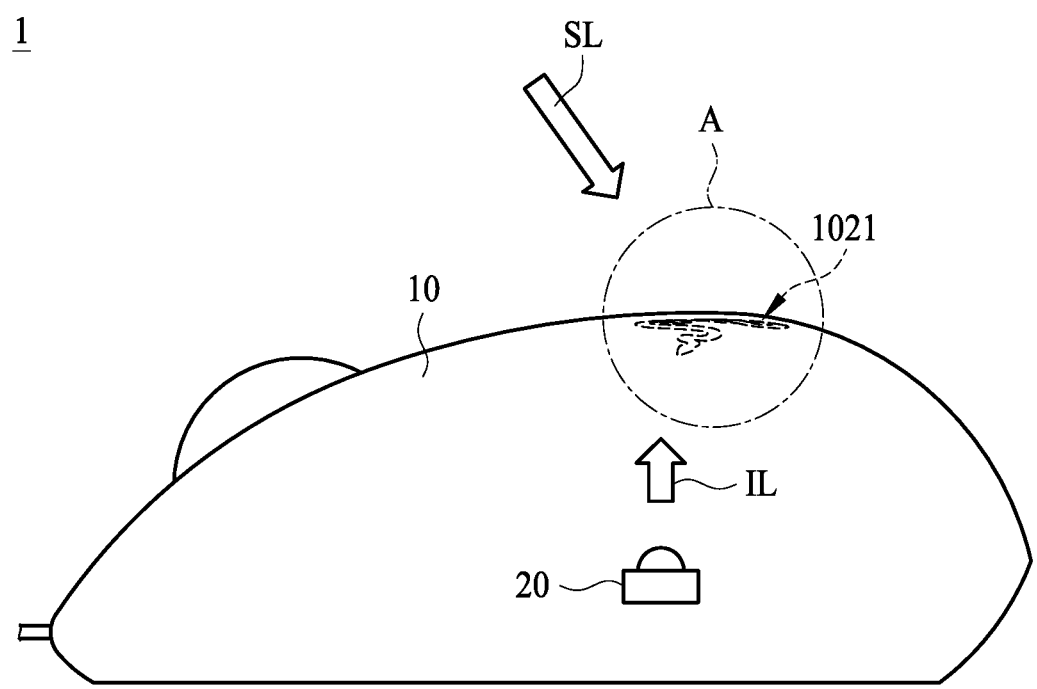
FIG. 3 schematically illustrates an electronic device with a housing structure according to an embodiment of the present invention.
Figure 4A:
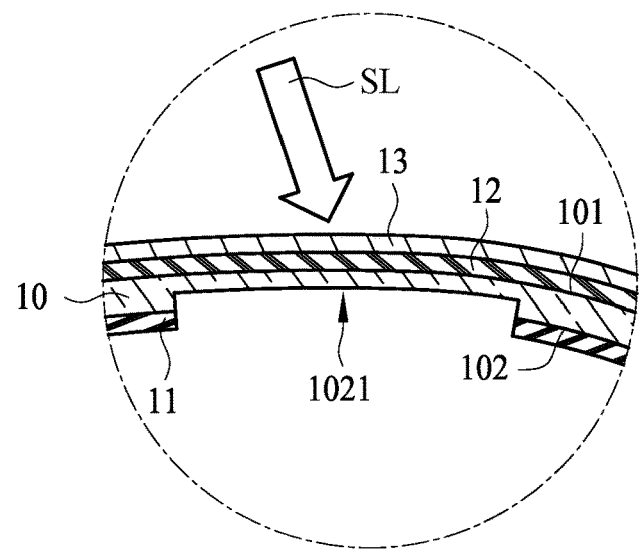
FIG. 4A is a schematic cross-sectional view illustrating an enlarged portion A of the housing structure as shown in FIG. 3, in which the illumination module of the electronic device is disabled.
Figure 4B:
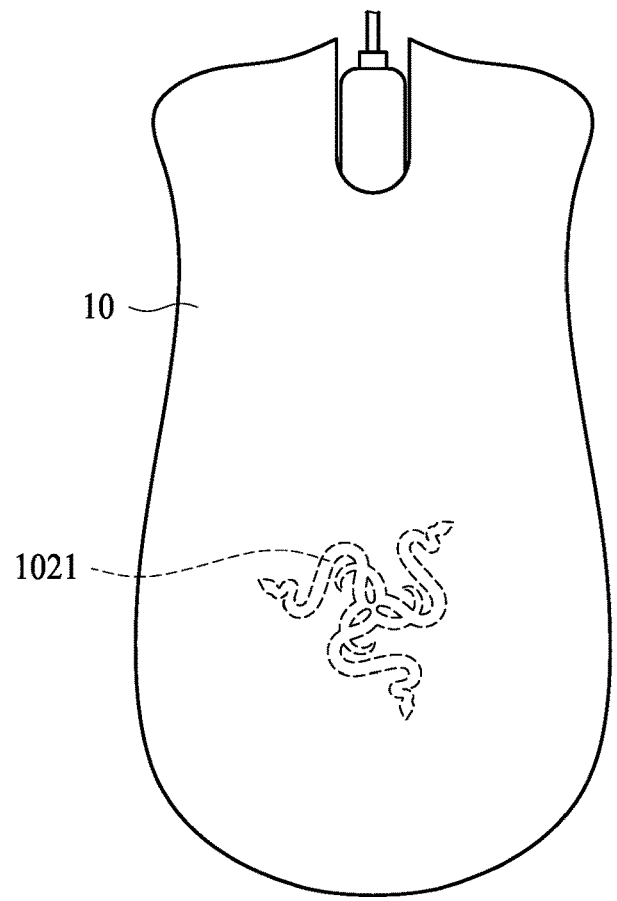
FIG. 4B is a schematic top view illustrating the electronic device as shown in FIG. 3, in which the pattern is hidden.
Figure 5A:
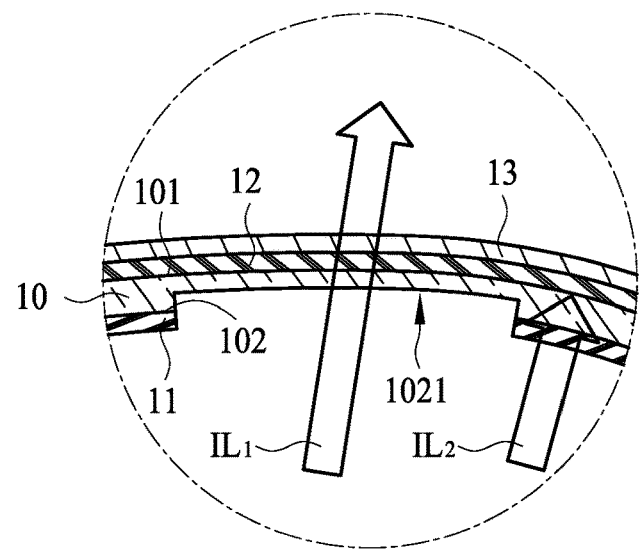
FIG. 5A is a schematic cross-sectional view illustrating an enlarged portion A of the housing structure as shown in FIG. 3, in which the illumination module of the electronic device is enabled.
Figure 5B:
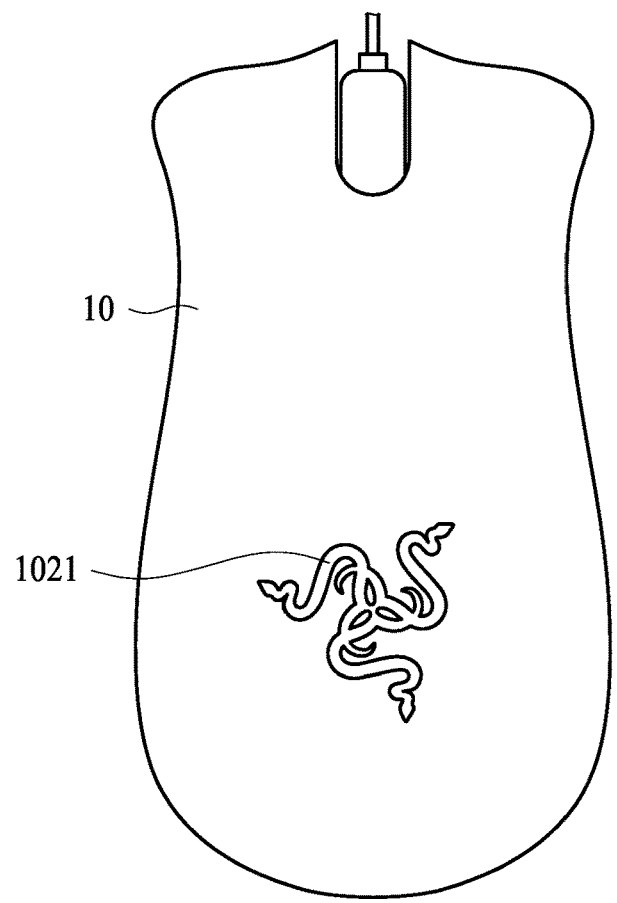
FIG. 5B is a schematic top view illustrating the electronic device as shown in FIG. 3, in which the pattern is visible.

Please refer to FIG. 3, FIG. 4A, FIG. 4B, FIG. 5A and FIG. 5B. FIG. 3 schematically illustrates an electronic device with a housing structure according to an embodiment of the present invention. FIG. 4A is a schematic cross-sectional view illustrating an enlarged portion A of the housing structure as shown in FIG. 3, in which the illumination module of the electronic device is disabled. FIG. 4B is a schematic top view illustrating the electronic device as shown in FIG. 3, in which the pattern is hidden. FIG. 5A is a schematic cross-sectional view illustrating an enlarged portion A of the housing structure as shown in FIG. 3, in which the illumination module of the electronic device is enabled. FIG. 5B is a schematic top view illustrating the electronic device as shown in FIG. 3, in which the pattern is visible.

As shown in FIG. 3, the electronic device 1 is a mouse. An engraved trench 1021 is formed in a holding end of a housing body 10. The electronic device 1 comprises an illumination module 20. The illumination module 20 is disposed within the electronic device 1. In addition, the illumination module 20 is used to emit an internal light beam IL to the engraved trench 1021. An example of the illumination module 20 includes but is not limited to a light emitting diode module, an organic light emitting diode module, a quantum dots light emitting diode module or an electroluminescence module. Moreover, an external light beam SL in the surrounding of the electronic device 1 may strike the outer surface of the housing body 10.

Hereinafter, the usage scenarios of the electronic device 1 will be described as follows.

Please refer to FIG. 4A. In this scenario, the illumination module 20 within the electronic device 1 is disabled. When the external light beam SL strikes the housing body 10 at the position corresponding to the engraved trench 1021, the external light beam SL is absorbed by the second light-shielding layer 12. Since the external light beam SL is unable to be transmitted to the engraved trench 1021, the external light beam SL is not reflected by the engraved trench 1021. Since the external light beam SL is not reflected by the engraved trench 1021, the pattern of the engraved trench 1021 is not visible through reflection (see FIG. 4B). Under this circumstance, the visual effect corresponding to the hidden pattern is provided.

Please refer to FIG. 5A. In this scenario, the illumination module 20 within the electronic device 1 and located beside the second surface 102 is enabled. Consequently, the illumination module 20 emits the internal light beam IL. When the internal light beam IL is projected to the position outside the engraved trench 1021, a second-portion internal beam IL2 of the internal light beam IL is absorbed by the first light-shielding layer 11 and the second light-shielding layer 12. That is, the second-portion internal beam IL2 cannot be transmitted through the housing body 10 of the electronic device 1. Whereas, when the internal light beam IL is projected to the position of the engraved trench 1021, a first-portion internal beam IL1 of the internal light beam IL is projected to the second light-shielding layer 12. In accordance with a feature of the present invention, the intensity of the first-portion internal beam IL1 is higher than the intensity of the external light beam SL. In accordance with another feature of the present invention, the light-shading percentage of the second light-shielding layer 12 is selected such that the first-portion internal beam IL1 is permitted to be transmitted through the second light-shielding layer 12. Consequently, the first-portion internal beam IL1 can be transmitted through the housing body 10 of the electronic device 1. That is, the pattern corresponding to the engraved trench 1021 is visible through the holding end of the housing body 10 (see FIG. 5B). Under this circumstance, the visual effect corresponding to the visible pattern is provided.

In the above embodiment, the electronic device 1 is a mouse, and the housing structure of the present invention is applied to the mouse. It is noted that the applications of the housing structure of the present invention are not restricted. For example, the housing structure is applied to a keyboard, a display screen, a desktop computer, a notebook computer, a tablet computer, a personal digital assistant, a smart phone, a game console, a printer, an office machine, a scanner or any other appropriate home appliance.

Moreover, the illumination module 20 is operated in a monochromatic lighting mode or a polychromatic lighting mode. Alternatively, the illumination module 20 is a combination of plural light-emitting units. In case that the illumination module 20 is operated in the polychromatic lighting mode or the illumination module 20 is the combination of plural light-emitting units, a colorful pattern or a color-changeable pattern corresponding to the engraved trench 1021 is visible after the internal light beam IL is transferred through the engraved trench 1021.

From the above descriptions, the housing structure of the present invention has a hidden pattern. When the illumination module within the electronic device is disabled, the pattern hidden in the housing structure is not visible. Consequently, the appearance consistency of the electronic device is maintained. When the illumination module within the electronic device is enabled, the pattern hidden in the housing structure is visible. Under this circumstance, the electronic device provides distinctiveness and special visual effect. In other words, the housing structure of the present invention is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A housing structure for an electronic device, the electronic device comprising an illumination module within the housing structure, the housing structure comprising: a light-transmissible housing body having a first surface and a second surface, wherein the first surface and the second surface are opposed to each other; a first light-shielding layer formed on the second surface; an engraved trench formed in the second surface and a pattern is formed in the engraved trench; a second light-shielding layer formed on the first surface; and a protective layer formed over the second light-shielding layer, wherein the engraved trench is covered by the second light-shielding layer, such that when an external light beam strikes the first surface of the housing body at the position corresponding to the engraved trench, the external light beam is absorbed by the second light-shielding layer and is unable to be transmitted to the engraved trench so that the pattern of the engraved trench is not visible from outside; and wherein the engraved trench is not covered by the first light-shielding layer, such that when the illumination module emits an internal light beam to the second surface, the internal light beam is transmitted through the engraved trench not covered with the first light-shielding layer, and the internal light beam is not able to be transmitted through an area of the housing body having the first light-shielding layer and the second light-shielding layer formed thereon, so that only the pattern is illuminated and visible from outside.

2. The housing structure according to claim 1, further comprising a third light-shielding layer, wherein the third light-shielding layer is arranged between the second light-shielding layer and the protective layer.

3. The housing structure according to claim 1, wherein the pattern is a picture, a text, a number, a symbol, or a combination thereof.

4. The housing structure according to claim 1, wherein the first light-shielding layer is made of rubbery paint, polyurethane paint, or the combination thereof.

5. The housing structure according to claim 1, wherein the second light-shielding layer is made of rubbery paint, polyurethane paint, or the combination thereof.

6. The housing structure according to claim 2, wherein the third light-shielding layer is made of rubbery paint, polyurethane paint, or the combination thereof.

7. The housing structure according to claim 1, wherein the protective layer is made of light curable paint.

8. The housing structure according to claim 1, wherein the light-transmissible housing body is made of acrylonitrile-butadiene-styrene resin, polycarbonate or acrylic resin.

9. The housing structure according to claim 1, wherein the electronic device further comprises an illumination module, which is located beside the second surface of the electronic device, wherein the illumination module emits a light beam to the engraved trench, so that the pattern is shown on the first surface of the electronic device.

10. The housing structure according to claim 9, wherein the illumination module is a light emitting diode module, an organic light emitting diode module, a quantum dots light emitting diode module or an electroluminescence module.

11. The housing structure according to claim 1, wherein the electronic device is a mouse, a keyboard, a display screen, a desktop computer, a notebook computer, a tablet computer, a personal digital assistant, a smart phone, a game console, a printer, an office machine or a scanner.

* * * * *